(12) United States Patent
Okoroanyanwu

(10) Patent No.: US 6,518,175 B1
(45) Date of Patent: Feb. 11, 2003

(54) PROCESS FOR REDUCING CRITICAL DIMENSIONS OF CONTACT HOLES, VIAS, AND TRENCH STRUCTURES IN INTEGRATED CIRCUITS

(75) Inventor: Uzodinma Okoroanyanwu, Mountain View, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/771,842

(22) Filed: Jan. 29, 2001

(51) Int. Cl.[7] .................... H01L 21/4763; H01L 21/302

(52) U.S. Cl. .................. 438/637; 438/638; 438/640; 438/725; 438/760; 438/795; 438/948; 438/961

(58) Field of Search .................. 438/725, 760, 438/780, 795, 948, 961, 637–640; 430/97, 311–317

(56) References Cited

U.S. PATENT DOCUMENTS

| | | | |
|---|---|---|---|
| 4,904,866 A | 2/1990 | Collins et al. | |
| 5,003,178 A | 3/1991 | Livesay | 250/492.3 |
| 5,573,634 A | 11/1996 | Ham | |
| 5,965,461 A | 10/1999 | Yang et al. | 438/717 |
| 6,103,457 A | 8/2000 | Gabriel | 430/318 |
| 6,107,172 A | 8/2000 | Yang et al. | 438/585 |
| 6,271,127 B1 * | 8/2001 | Liu et al. | |
| 6,319,824 B1 * | 11/2001 | Lee et al. | |

OTHER PUBLICATIONS

U.S. patent application Ser. No. 09/771,820, Okoroanyanwu, filed Jan. 2001.

Livesay, W. R., "Large–area electron–beam source," Journal of Vacuum Science & Technology B, vol. 11, No. 6, Nov./Dec. 1993, pp. 2304–2308, American Vacuum Society.

Yang, J. J. et al, "Electron Beam Processing for Spin–on Polymers and its Applications to Back–End–of–Line (BEOL) Integration," Materials Research Society Symposium Proceedings, vol. 511, 1998, pp. 49–55, Materials Research Society.

Ross et al, "Plasma Etch Characteristics of Electron Beam Processed Photoresist," The Society of Photo–Optical Instrumentation Engineers, vol. 2438, 1995, pp. 803–816, SPIE–The International Society for Optical Engineering.

Grün, Von A. E., "Lumineszenz–photometrische Messungen der Energieabsorption im Strahlungsfeld von Elektronenquellen Eindimensionaler Fall in Luft," Zeitschrift für Naturforschung, vol. 12a, 1957, pp. 89–95, publisher: Zeitschrift für Naturforschung; full English Translation attached (11 pgs.).

* cited by examiner

*Primary Examiner*—Ha Tran Nguyen
(74) *Attorney, Agent, or Firm*—Foley & Lardner

(57) ABSTRACT

An integrated circuit fabrication process to pattern reduced feature size is disclosed herein. The process includes reducing the width of a patterned area of a patterned photoresist layer provided over a substrate before patterning the substrate. The patterned area is representative of a feature to be formed in the substrate. The width of the feature is reduced by an electron beam mediated heating and flowing of select areas of the patterned photoresist layer.

22 Claims, 3 Drawing Sheets

PROCESS FOR REDUCING CRITICAL DIMENSIONS OF CONTACT HOLES, VIAS, AND TRENCH STRUCTURES IN INTEGRATED CIRCUITS

CROSS-REFERENCE TO RELATED APPLICATIONS

The present invention is related to U.S. application Ser. No. 09/771,820 by Uzodinma Okoroanyanwu entitled "Process for Reducing the Pitch of Contact Holes, Vias, and Trench Structures in Integrated Circuits" filed on an even date herewith and assigned to the Assignee of the present application.

FIELD OF THE INVENTION

The present invention relates generally to integrated circuit (IC) features. More particularly, the present invention relates to a method and an apparatus for fabricating reduced contact holes, vias, and trench features in integrated circuits.

BACKGROUND OF THE INVENTION

The semiconductor or integrated circuit (IC) industry aims to manufacture integrated circuits (ICs) with higher and higher densities of devices on a smaller chip area to achieve greater functionality and to reduce manufacturing costs. This desire for large scale integration has led to continued shrinking of circuit dimensions and device features. The ability to reduce the size of structures, such as, gate lengths in field-effect transistors and the width of conductive lines, is driven by lithographic performance.

Features, such as, contacts and vias, provide a conducting path for electrically connecting one device to another or for electrically connecting circuits on various layers of the chip. As the number of devices per unit area have increased, so has the number of contacts and vias necessary to route signals and power throughout the chip. This, in turn, has required a decrease in feature sizes, including contacts and vias, and in feature pitches.

Feature size has been steadily decreasing with the use of shorter lithographic or exposure wavelengths and resolution enhancement techniques, such as, phase shifting masks and off-axis illumination. However, even with such lithographic techniques, the feature size is usually constrained to a dimension approximately equal to the lithographic wavelength divided by two times the numerical aperture (NA) of the lens of the exposure system. For example, for 193 nanometer (nm) lithographic systems with NA=0.63, the minimum feature size is approximately 150 nm.

Thus, there is a need for a process of fabricating an integrated circuit having a feature size smaller than the lithographic wavelength associated therewith. There is a further need for a process of fabricating an integrated circuit having reduced dimensions of contacts, vias, lines, spaces, interconnects, gates, doped regions, and/or etched regions than is achievable using conventional lithographic systems. There is still a further need for a process of fabricating an integrated circuit having a reduced feature size that utilizes existing equipment and materials and does not significantly decrease throughout.

BRIEF SUMMARY OF THE INVENTION

An exemplary embodiment relates to a method of fabricating reduced feature size in an integrated circuit. The integrated circuit includes a patterned photoresist layer provided over a substrate. The patterned photoresist layer being patterned with radiation at a lithographic wavelength and in accordance with a pattern on a mask or reticle. The method includes providing an electron beam to at least one area of an aperture included in the patterned photoresist layer. The aperture has sidewalls and a width. The method further includes transforming the sidewalls in response to the electron beam, and forming a feature in the substrate in accordance with the transformed sidewalls of the aperture.

Another exemplary embodiment relates to an integrated circuit fabrication system. The system includes a mask or reticle including an image of a feature. A photoresist layer provided over a semiconductor substrate including an aperture representative of the image of the feature, the aperture having a width and sidewalls. The system further includes a source of electromagnetic radiation configured to form a reduced width of the aperture by moving the sidewalls.

Still another exemplary embodiment relates to an integrated circuit fabrication process. The process includes reducing a width associated with a patterned area in a photoresist layer provided over a substrate. The patterned area is representative of a feature. The process further includes forming the feature in the substrate. The feature has the reduced width associated with the patterned area. The reducing step includes having an electron beam incident on at least a part of the patterned area.

BRIEF DESCRIPTION OF THE DRAWINGS

The preferred embodiment will become more fully understood from the following detailed description, taken in conjunction with the accompanying drawings, wherein like reference numerals denote like elements, in which.

DETAILED DESCRIPTION OF THE EXEMPLARY EMBODIMENTS

With reference to FIGS. 1–5, an exemplary embodiment of an advantageous process for fabricating reduced feature size in an integrated circuit (IC) will be described. The advantageous process is preferably implemented to fabricate reduced features such as, contacts, vias, interconnects, and/or trenches. The advantageous process permits such features to be reduced in size by up to four times smaller than the size of features achievable using conventional lithographic techniques and systems. The advantageous process also provides fabrication of reduced feature pitch in an IC.

Figure 1:
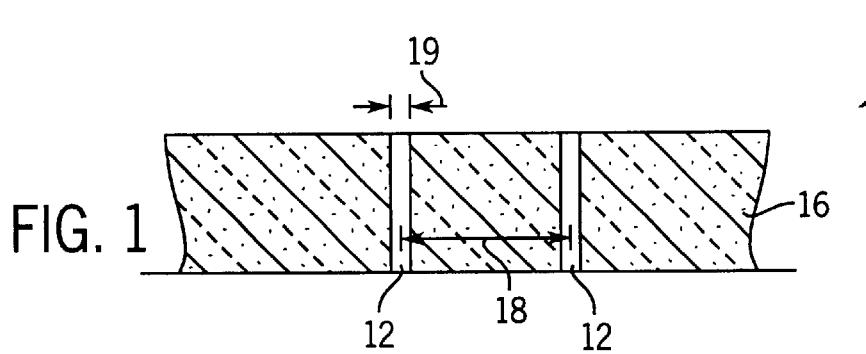
FIG. 1 is a cross-sectional view of a portion of an integrated circuit in accordance with an exemplary embodiment, showing a reduced feature size.

With reference to FIG. 1, a portion 10 of an integrated circuit (IC) includes etched areas 12 in a substrate 16. Each of etched areas 12 can be a feature, such as, a contact hole, a via, a trench, or a space in portion 10. Each of etched areas 12 is similar to each other and has a width 19. The distance from the center of a given etched area 12 to the center of an adjacent etched area 12 is a conventional pitch 18.

Figure 3:
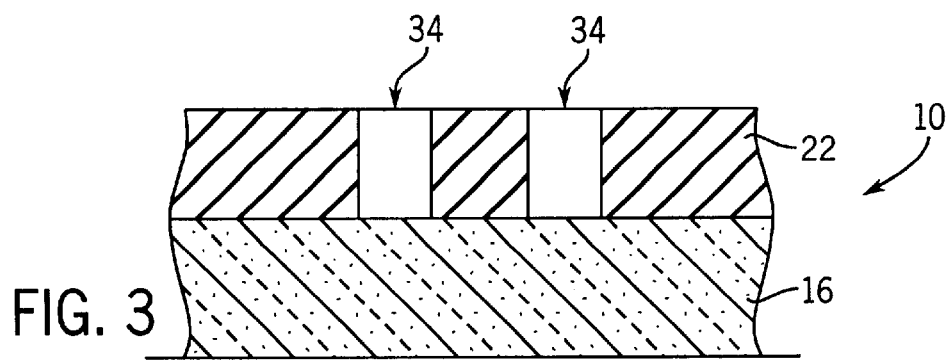
FIG. 3 is a cross-sectional view of the portion of the integrated circuit illustrated in FIG. 2, showing a developing step.

In FIG. 1, width 19 of each of etched areas 12 is approximately three times smaller than the dimension of an aperture 34 (i.e., a conventional aperture) (FIG. 3). For example, in a 193 nm lithography system, aperture 34 may be approximately 150 nm while each of etched areas or aperture 12 may approach 50 nm. Alternatively, it is contemplated that each of etched areas of aperture 12 may be less than half the dimension of aperture 34. Among others, the feature or structure size, the dimension of conventional pitch 18, the characteristics of the photoresist material used to fabricate etched areas 12 and/or the density of features or structures provided on a mask used to fabricate etched areas 12 determine the possible minimum width 19 for a given IC.

Figure 2:
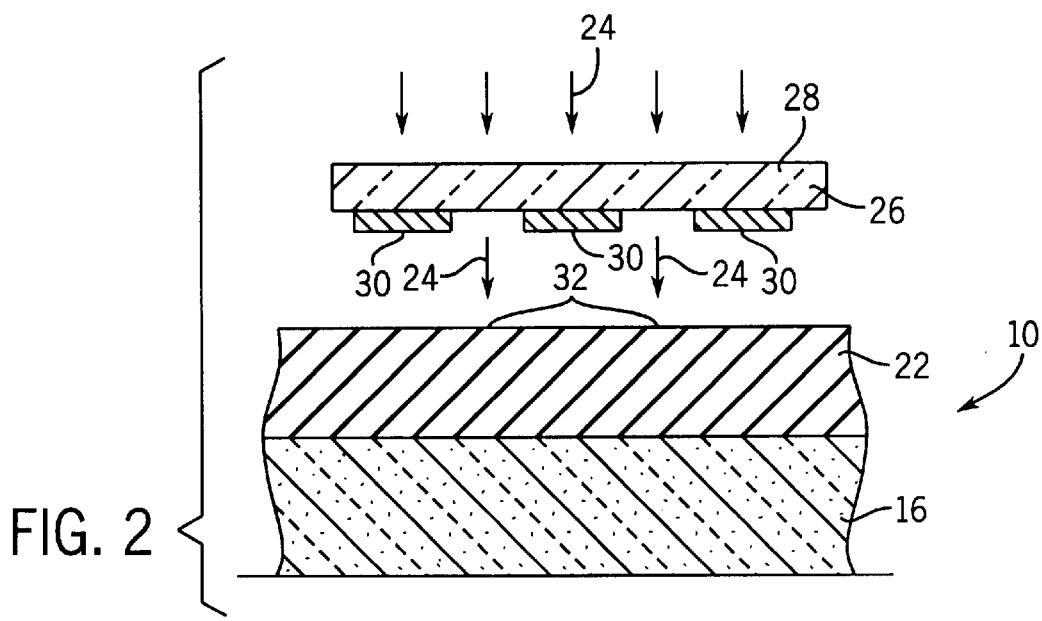
FIG. 2 is a cross-sectional view of the portion of the integrated circuit illustrated in FIG. 1, showing an exposure step.

The fabrication of etched areas 12 will be described with respect to FIGS. 2–5. With reference to FIG. 2, an exposure step comprising the advantageous process is performed on portion 10 of the IC. Portion 10 includes a photoresist layer 22 provided on substrate 16. Substrate 16 can be an IC wafer, a semiconductive material, an insulative material, a conductive material, layers above any of the listed materials, or a base layer. Substrate 16 can be an industry standard silicon wafer. Substrate 16 can include one or more layers of materials and/or features, such as, lines, interconnects, vias, doped regions, etc., and can further include devices, such as, transistors, microactuators, diodes, etc. Substrate 16 is not described in a limiting fashion.

Photoresist layer 22 is selected to have photochemical reactions in response to electromagnetic radiation 24 from a light source (not shown). Photoresist layer 22 is preferably a chemically amplified, positive tone, photoresist designed for 248 nm, 193 nm, 157 nm, or 13.4 nm exposure, applied to substrate 16 by spin coating. Alternatively, photoresist layer 22 may be a negative resist material applied to substrate 16.

Radiation 24 is provided by a single light source or multiple light sources at various wavelength ranges depending on the material composition of photoresist layer 22. Radiation 24 can be electromagnetic energy emitted from an excimer laser, an ND:YAG laser, a frequency multiplied ND:YAG laser, a He-Ne scanning laser, or other light source. For example, radiation 24 can be radiation having a wavelength in the ultraviolet (UV), vacuum ultraviolet (VUV), deep ultraviolet (DUV), or extreme ultraviolet (EUV) range.

Radiation 24 is provided via a mask or reticle 26 in accordance with a pattern on mask or reticle 26 to photoresist layer 22. Mask or reticle 26 is a conventional mask or reticle including a transparent substrate 28 (e.g., fused silica) and an opaque or absorbing material 30 (e.g., chromium). Mask 26 provides a pattern of desirable features, such as, lines, spaces, contacts, and/or vias, using material 30.

Although not shown, other components or equipment can be provided between radiation 24 and portion 10 to transfer the image on mask 26 to photoresist layer 22, such as, an optical system (e.g., one or more lens assemblies).

In one embodiment, photoresist layer 22 is a positive resist material. Layer 22 and radiation 24 are selected to transfer the pattern or image provided on mask 26 to layer 22. Areas of layer 22 where radiation 24 is incident thereon (i.e., exposed areas 32) undergo a photochemical reaction and become soluble. In a developing step (FIG. 3), exposed areas 32 are removed from portion 10, leaving behind apertures 34. The developing step utilizes a wet or dry developer. For example, a solvent developer, such as, tetramethylammonium hydroxide, can be selected to develop the material comprising layer 22.

In one embodiment, apertures 34 are circular, square, or rectangularly shaped. Each of apertures 34 is approximately the dimension of one lithographic feature that is consistent with the technology node.

Figure 4:
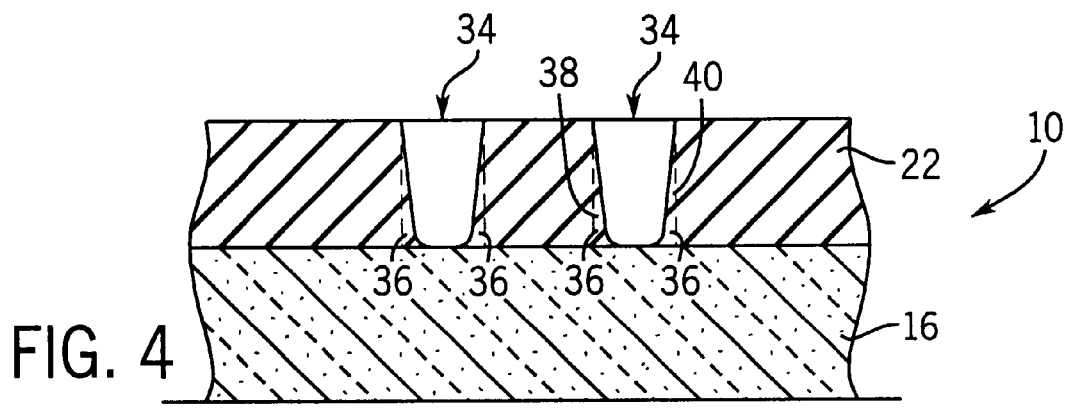
FIG. 4 is a cross-sectional view of the portion of the integrated circuit illustrated in FIG. 3, showing an electron beam exposure step.

After the developing step, an electron-beam exposure step is performed on portion 10 (FIG. 4). A flood electron source, preferably of a cold cathode type, generates electrons from the energetic input of ions to perform the electron-beam exposure. Patterned layer 22 is flood electron beam exposed to create shrink areas 36. The electron beam interacts with the molecules comprising layer 22, in particular, the molecules comprising the sidewalls of apertures 34, to the extent that these molecules are brought to a higher temperature sufficient to at least partially liquefy or plasticize layer 22. The sidewalls of each of apertures 34 in this liquefied or viscous state flow downward, due to gravity, to decrease the width of apertures 34.

Through careful selection of electron beam parameters, and additionally through selection of the material comprising layer 22, the melt and flow conditions associated with generation of areas 36 can be controlled. For example, the electron beam typically needs to come in contact with a given molecule in layer 22 to cause the heating of that molecule. Thus, the penetration distance or depth of the electron beam should be considered in generating areas 36.

By varying the electron beam energy or the accelerating voltage, beam current, dose, processing gas, and/or substrate temperature, it is possible to control the penetration depth of the electron beam such that a curing depth and response of layer 22 can be controlled. The penetration depth of the electrons, comprising the electron beam, into a target material (i.e., layer 22) is a function of the electron beam energy, and the relationship is approximately given by:

$$R_g = \frac{0.046\, V_a^{1.75}}{d}$$

where $R_g$ is the penetration depth in microns, $V_a$ is the accelerating voltage or energy in keV, and d is the density of the target material in $g/cm^3$.

Although not shown, formation of areas 36 may further include additional processing steps and/or equipment to ensure that desired areas 36 are formed in layer 22 without otherwise distorting the pattern transferred to layer 22 or substrate 16. For example, the sidewalls of apertures 34 may be cooled once flowing has commenced to specify the shape of areas 36. It is also contemplated that exposures other than electron beam exposure may be used to form areas 36, as long as the etched areas 12 etched from the pattern defined by areas 36 can be achieved, as described herein.

Areas 36 represent distortions to the morphology of apertures 34. These distortions, however, advantageously reduce the width of each of apertures 34, especially at the bottoms of apertures 34 (i.e., at the interface of layer 22 and substrate 16). In a cross-sectional view of portion 10, a pair of areas 36 (e.g., a left sidewall 38 and a right sidewall 40) form new sidewalls for each of apertures 34. Because left and right sidewalls 38, 40 both slope downwardly toward the bottom of a given aperture 34, the hole width at the top of walls 38, 40 is larger than the hole width at the bottom of walls 38, 40. For example, if the width of a given aperture 34 prior to the electron beam exposure step is 150 nm, then the bottom width of a given aperture 34 with left and right sidewalls 38, 40 becomes 130 nm. Accordingly, after etching, the dimension of each of etched areas 12 is in the range of 120–130 nm and can approach a critical dimension of sub-100 nm.

Figure 5:
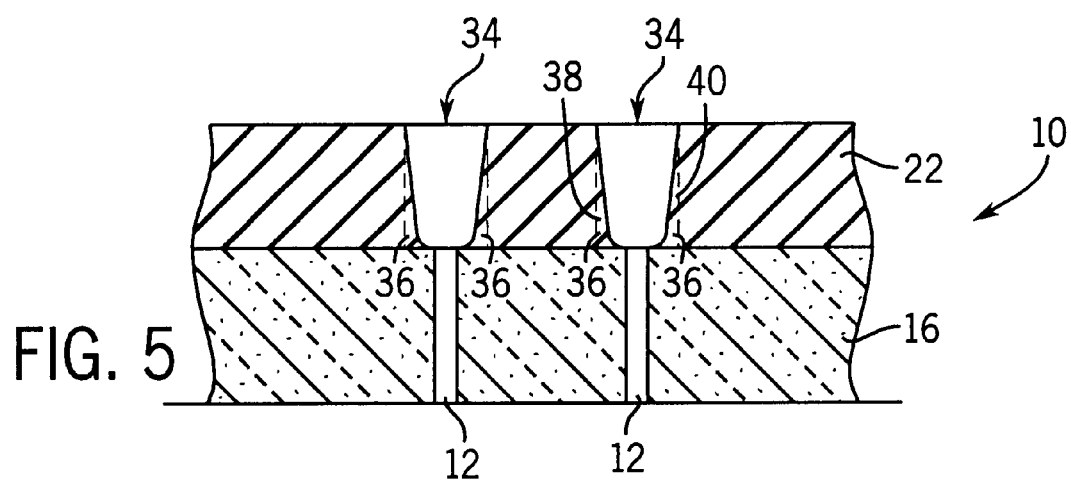
FIG. 5 is a cross-sectional view of the portion of the integrated circuit illustrated in FIG. 4, showing an etching step.

Utilizing the pattern defined by areas 36 of layer 22, an etching step performed on portion 10 forms etched areas 12 (FIG. 5). Areas 36 effectively pattern reduced or shrunken features, such as, etched areas 12 into substrate 16. For example, etched areas 12 can be contact holes, conductive vias, or trench features utilized in ICs or in the manufacture of ICs. The width or dimension of each of etched areas 12 is smaller than the width of any of apertures 34 without areas 36 (i.e., conventional holes patterned using merely a mask or reticle, such as mask 26, and using conventional lithographic techniques). The width or dimension of each of etched areas 12 is determined by the bottom width of aperture 34, as further defined by areas 36 (e.g., left and right sidewalls 38, 40).

Figure 6:
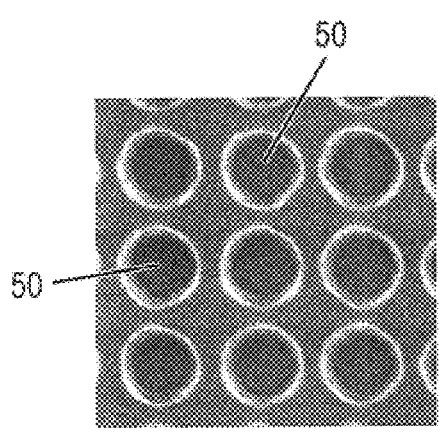
FIG. 6 is a top planar view of an SEM image of nominal contact holes.
Figure 7:
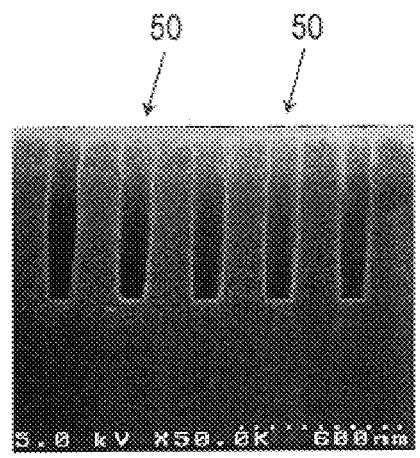
FIG. 7 is a cross-sectional view of an SEM image of the nominal contact holes of FIG. 6.
Figure 8:
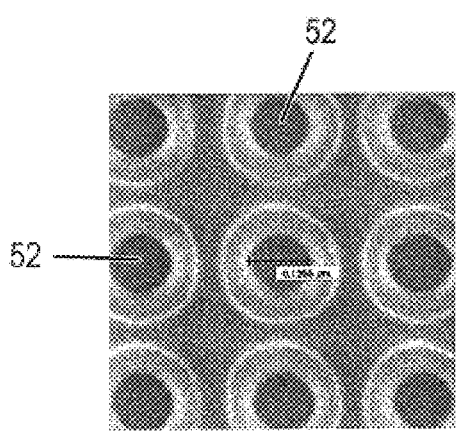
FIG. 8 is a top planar view of an SEM image of reduced contact holes formed from the electron beam exposure step.
Figure 9:
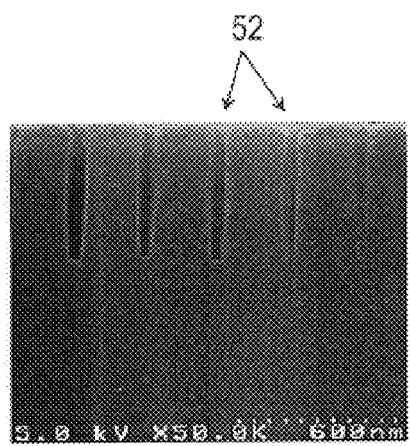
FIG. 9 is a cross-sectional view of an SEM image of the reduced contact holes of FIG. 8.
Figure 10:
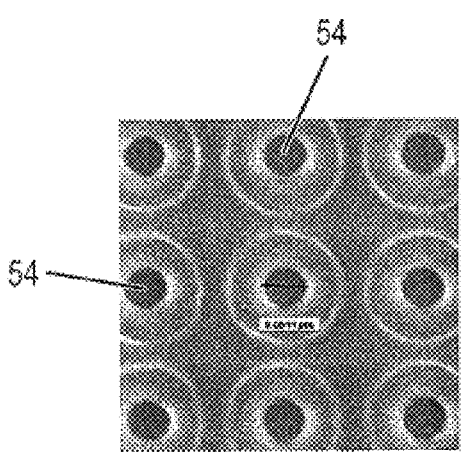
FIG. 10 is a top planar view of an SEM image of another reduced contact holes formed from the electron beam exposure step.
Figure 11:
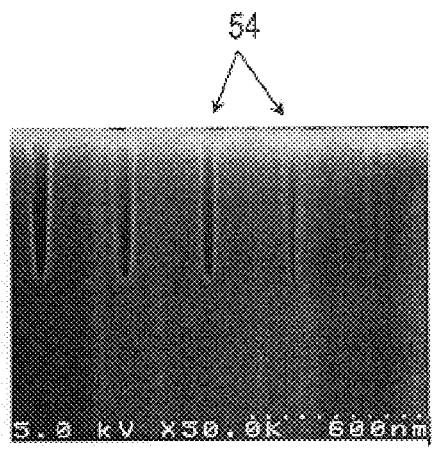
FIG. 11 is a cross-sectional view of an SEM image of the another reduced contact holes of FIG. 10.

Shown in FIGS. 6–11 are scanning electron microscope (SEM) images of contact holes formed using the electron beam exposure step. FIG. 6 is a top planar SEM image of nominal contact holes 50, each having a diameter of approximately 150 nm. FIG. 7 is a cross-sectional SEM image of nominal contact holes 50 of FIG. 6. Nominal contact holes 50 were formed without an electron beam treatment. In FIGS. 8–9, there are shown contact holes 52 formed by electron beam irradiation, the electron beam having the following parameters: accelerating voltage=20 keV, beam current=4 mA, and dose=750 $\mu C/cm^2$. Under these conditions, it is possible to shrink the diameter or width of each of contact holes 52 from a nominal value of 150 nm to 130 nm, as shown. In FIGS. 10–11, contact holes 54 are formed by irradiating with an electron beam having the following parameters: accelerating voltage=20 keV, beam current=5 mA, and dose=1000 $\mu C/cm^2$. Under these conditions, the diameter or width of each of contact holes 54 is reducible from a nominal value of 150 nm to approximately 84 nm, as shown.

In one embodiment, electron beam parameters suitable to form areas 36, to form the reduced width or critical dimensions associated with areas 12, are: accelerating voltage= approximately 5–20 keV, beam current=approximately 2–5 mA, and dose=approximately 500–2000 $\mu C/cm^2$. Because the dimension of each of areas 12 is dependent on the parameters of the applied electron beam in the electron beam exposure step, it is possible to achieve a wide range of reduced dimensions, as desired, and it is even possible to completely close apertures 34, i.e., prevent formation of areas 12 via apertures 34, with an electron beam having aggressive enough beam parameters.

It is understood that while the preferred embodiment and specific examples are given, they are for the purpose of illustration only and are not limited to the precise details described herein. For example, features other than contact holes, or vias, such as, trenches, can benefit from the advantageous process. Various modifications may be made in the details within the scope and range of the equivalence of the claims without departing from what is claimed.

What is claimed is:

1. A method of fabricating reduced feature size in an integrated circuit, the integrated circuit including a patterned photoresist layer provided over a substrate, the patterned photoresist layer being patterned with radiation at a lithographic wavelength and in accordance with a pattern on a mask or reticle, the method comprising the steps of:

providing an electron beam to at least one area of an aperture included in the patterned photoresist layer, the aperture having sidewalls and a width;

transforming the sidewalls in response to the electron beam, thereby creating shrink areas, wherein the electron beam at least partially liquefies or plasticizes molecules on the sidewalls to form the shrink areas; and forming a feature in the substrate in accordance with the transformed sidewalls of the aperture.

2. The method of claim 1, wherein providing an electron beam includes providing the electron beam at a dose in the range of approximately 500–2000 $\mu C/cm^2$.

3. The method of claim 1, wherein providing an electron beam includes providing the electron beam at an accelerating voltage in the range of approximately 5–20 keV and a current in the range of approximately 2–5 mA.

4. The method of claim 1, wherein the transforming step includes increasing the temperature of the sidewalls.

5. The method of claim 1, wherein the transforming step includes at least partially liquefying the sidewalls.

6. The method of claim 5, wherein the transforming step includes moving the at least partially liquefied sidewalls.

7. The method of claim 1, wherein the transforming step reduces the width of the aperture.

8. The method of claim 7, wherein the forming step includes forming the feature having a width smaller than the width of the aperture.

9. The method of claim 1, wherein the providing step includes flood exposing the aperture with the electron beam.

10. An integrated circuit fabrication process, the process comprising:

reducing a dimension associated with a patterned area in a photoresist layer provided over a substrate, the patterned area representative of a feature; and forming the feature in the substrate, the feature having the reduced dimension associated with the patterned area, wherein the reducing step includes having an electron beam incident on at least a part of the patterned area, the electron beam forming shrink areas by bringing molecules on sidewalls of the feature to a higher temperature.

11. The process of claim 10, wherein the reducing step includes at least partially liquefying and moving at least a part of the patterned area.

12. The process of claim 11, wherein the at least a part of the patterned area includes sidewalls.

13. The process of claim 10, wherein the feature has a dimension smaller than a dimension of one lithographic feature.

14. The process of claim 10, wherein the feature is selected from a group including a space, a contact hole, a conductive via, an interconnect, and a trench.

15. A process of fabricating reduced feature size in an integrated circuit fabrication system, the integrated circuit fabrication system including a mask or reticle including an image of a feature, a photoresist layer provided over a semiconductor substrate and including an aperture representative of the image of the feature, the aperture having a width and sidewalls, and a source of electromagnetic radiation, the process comprising:

reducing a dimension associated with the aperture of the photoresist layer; and forming the feature in the semiconductor substrate, the feature having the reduced dimension associated with the aperture, wherein reducing a dimension includes having an electromagnetic beam radiation incident on at least a part of the aperture wherein the reduced dimension is formed by shrink areas, the shrink areas are formed when the electromagnetic beam energy heats molecules on the part of the aperture.

16. The process of claim 15, wherein reducing a dimension includes the electromagnetic radiation being a flood electron beam.

17. The process of claim 16, wherein the flood electron beam has a dose in the range of approximately 500–2000 $\mu C/cm^2$.

18. The process of claim 16, wherein the flood electron beam is generated at an accelerating voltage in the range of approximately 5–20 keV.

19. The process of claim 16, wherein the flood electron beam is generated at a current in the range of approximately 2–5 mA.

20. The process of claim 16, wherein reducing a dimension includes the flood electron beam at least partially liquefying the sidewalls.

21. The process of claim 20, wherein reducing a dimension includes the sidewalls flowing to form modified sidewalls having a downwardly sloping shape.

22. The process of claim 15, wherein forming the feature in the semiconductor substrate includes forming the feature having a width smaller than the width of the aperture.

* * * * *